United States Patent [19]
Gerson

[11] Patent Number: 5,905,386
[45] Date of Patent: May 18, 1999

[54] CMOS SONET/ATM RECEIVER SUITABLE FOR USE WITH PSEUDO ECL AND TTL SIGNALING ENVIRONMENTS

[75] Inventor: Brian Donald Gerson, Coquitlam, Canada

[73] Assignee: PMC-Sierra Ltd., Burnaby, Canada

[21] Appl. No.: 09/031,715

[22] Filed: Feb. 27, 1998

Related U.S. Application Data

[62] Division of application No. 08/581,901, Jan. 2, 1996, Pat. No. 5,793,225.

[51] Int. Cl.$^6$ .................... H03K 19/0185; H03K 19/094
[52] U.S. Cl. ................................. 326/73; 326/68; 326/71
[58] Field of Search .................... 326/73, 68, 69, 326/70, 71, 72, 74, 17, 62, 63, 83

[56] References Cited

U.S. PATENT DOCUMENTS

| | | | |
|---|---|---|---|
| 5,517,148 | 5/1996 | Yin | 326/68 |
| 5,570,042 | 10/1996 | Ma | 326/68 |
| 5,606,268 | 2/1997 | Van Brunt | 326/73 |
| 5,617,045 | 4/1997 | Asahina | 326/68 |

FOREIGN PATENT DOCUMENTS

| | | | |
|---|---|---|---|
| 000146910 | 7/1985 | European Pat. Off. | 326/73 |
| 002133946 | 8/1984 | United Kingdom | 326/68 |

*Primary Examiner*—Michael Tokar
*Assistant Examiner*—Daniel D. Chang
*Attorney, Agent, or Firm*—Pascal & Associates

[57] ABSTRACT

A pulse receiver, comprising a pair of complementary symmetry metal oxide silicon (CMOS) common gate amplifiers connected between a 5 volt supply (ECL) voltage rail and an ECL ground (AGND), for receiving a pair of pulse input signals IN and INB and for providing a pair of first pulse signals, CMOS apparatus for distorting the first pulse signals, to create second pulse signals from the converter having a duty cycle having a longer low logic level interval than high logic level interval, a CMOS latch for receiving and latching the second output signals from the common gate amplifiers at logic levels compatible with circuits formed of CMOS elements, a CMOS double to single ended converter connected between a VDD voltage rail and VSS ground, for receiving the latched output signals, apparatus for providing an output signal referenced to VDD and ground from the converter.

6 Claims, 5 Drawing Sheets

CMOS SONET/ATM RECEIVER SUITABLE FOR USE WITH PSEUDO ECL AND TTL SIGNALING ENVIRONMENTS

This application is a division of U.S. application Ser. No. 08/581,901 filed Jan. 2, 1996, now U.S. Pat. No. 5,793,225.

FIELD OF THE INVENTION

This invention relates to data receivers and in particular to a high-speed pulse receiver.

BACKGROUND TO THE INVENTION

It would be advantageous to implement high speed pulse (data) receivers using complementary symmetry metal oxide silicon field effect transistors (CMOS) in order to be compatible with transceivers such as SONET/ATM transceivers whose core functionality is easily implemented using generic processes such as CMOS.

Further it is advantageous to be able to couple signals into such CMOS implemented transceivers with input signals which are at pseudo emitter coupled logic (PECL) signal levels in a differential mode and which provide output signals into CMOS circuits. In the past, this could only be implemented using an expensive technology such as BiCMOS. It is known that BiCMOS receivers are usually more power hungry than CMOS, since they use conventional current mode logic (CML) architectures. The use of this technology, and the output signal requirements also burden the digital circuits of the receivers with a higher complexity manufacturing process than would be desirable.

A conventional CML approach would have to perform a differential to single ended conversion (unless the designer is willing to use a differential logic scheme throughout the entire digital core), and duty cycle distortion of the output signal presents a problem.

SUMMARY OF THE INVENTION

The present invention is a system and circuit which is implemented in a conventional CMOS process, and input with signal levels compatible with conventional CMOS logic circuits, while having input signals with differential PECL signal levels or with single ended TTL output levels.

The inputs of the present invention are self biasing, and the output signal has low duty cycle distortion, and operates over a wide power supply voltage range. The input sensitivity is also high.

In accordance with an embodiment of the invention, a pair of complementary symmetry metal oxide silicon (CMOS) common gate amplifiers is connected between a supply comprising a 5 volt voltage rail and a ground (AGND), and receives a pair of pulse input signals IN and INB and provides a pair of pulse output signals. A CMOS latch receives and latches output signals from the common gate amplifiers at logic levels compatible with circuits formed of CMOS elements. A CMOS double to single ended converter is connected between a VDD voltage rail and VSS ground, and receives the latched output signals; a further circuit provides an output signal referenced to VDD and ground from the converter.

In accordance with another embodiment, a pulse receiver is comprised of a pair of inputs for receiving a differential pair of pulse signals, apparatus for converting the differential pair of pulse signals to a single output pulse signal having a pulse interval which corresponds to a time between rising edges of respective pulses of the differential pair of pulse signals, and apparatus for distorting the output pulse signal to create a duty cycle having a longer low logic level interval than high logic level interval.

BRIEF INTRODUCTION TO THE DRAWINGS

A better understanding of the invention will be obtained by reading the description of the invention below, with reference to the following drawings, in which.

Figure 4:
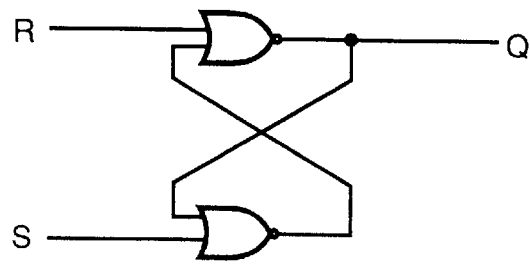
Figure 5:
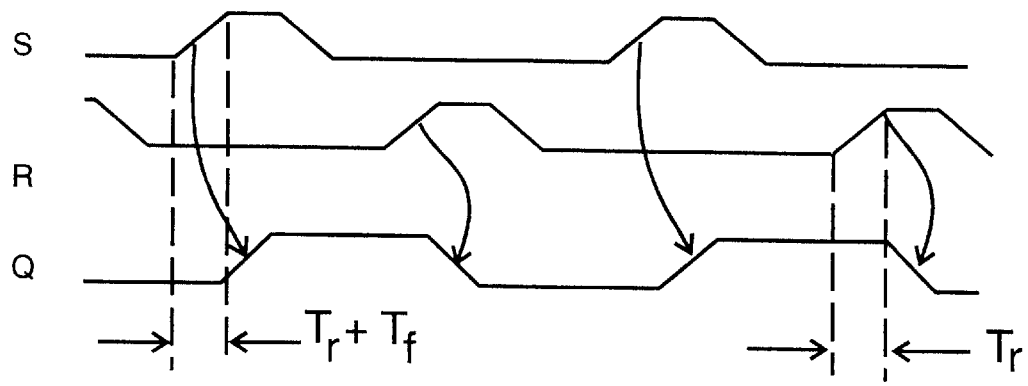
Figure 2:
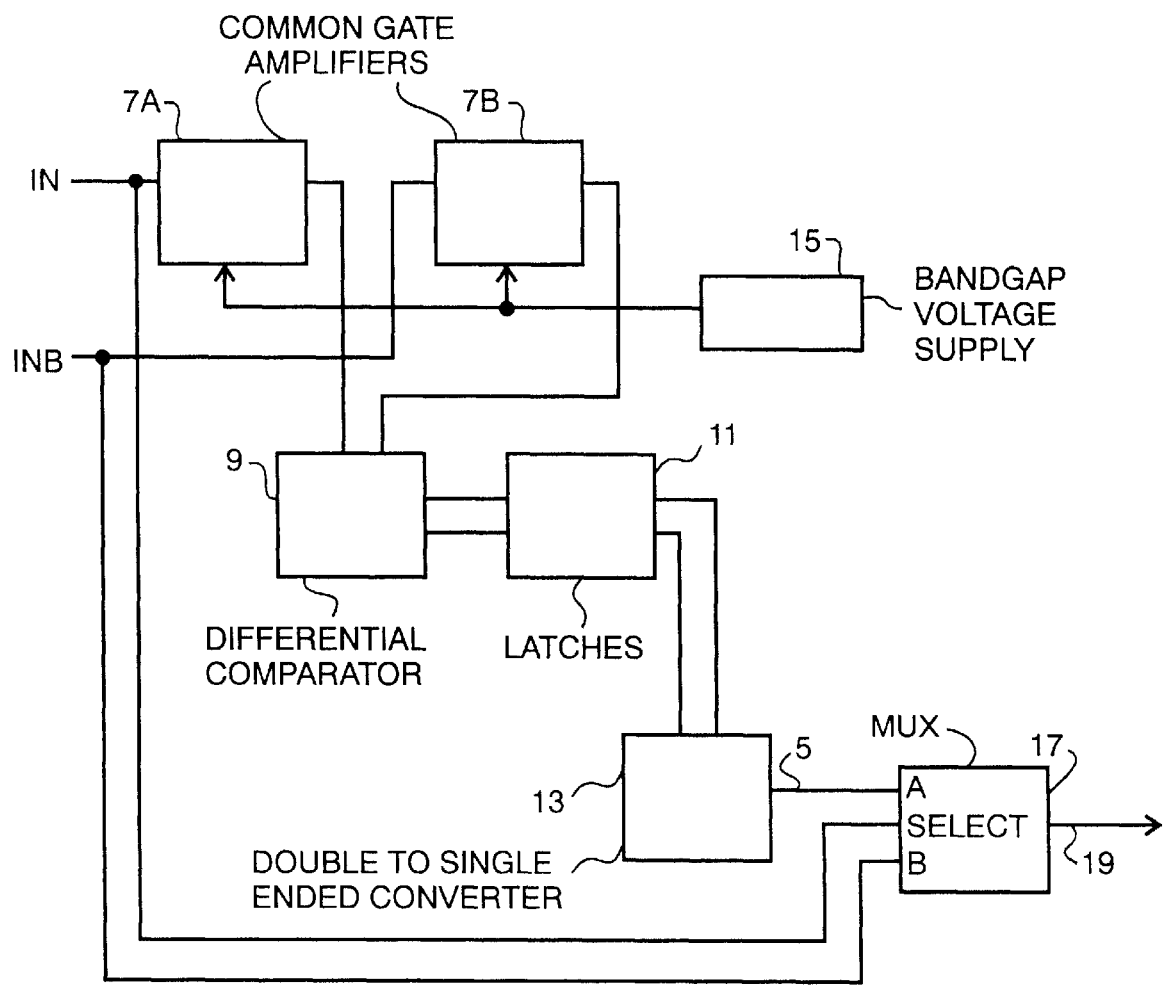
FIG. 2 is a basic block diagram of another embodiment of the invention.
Figure 3A:
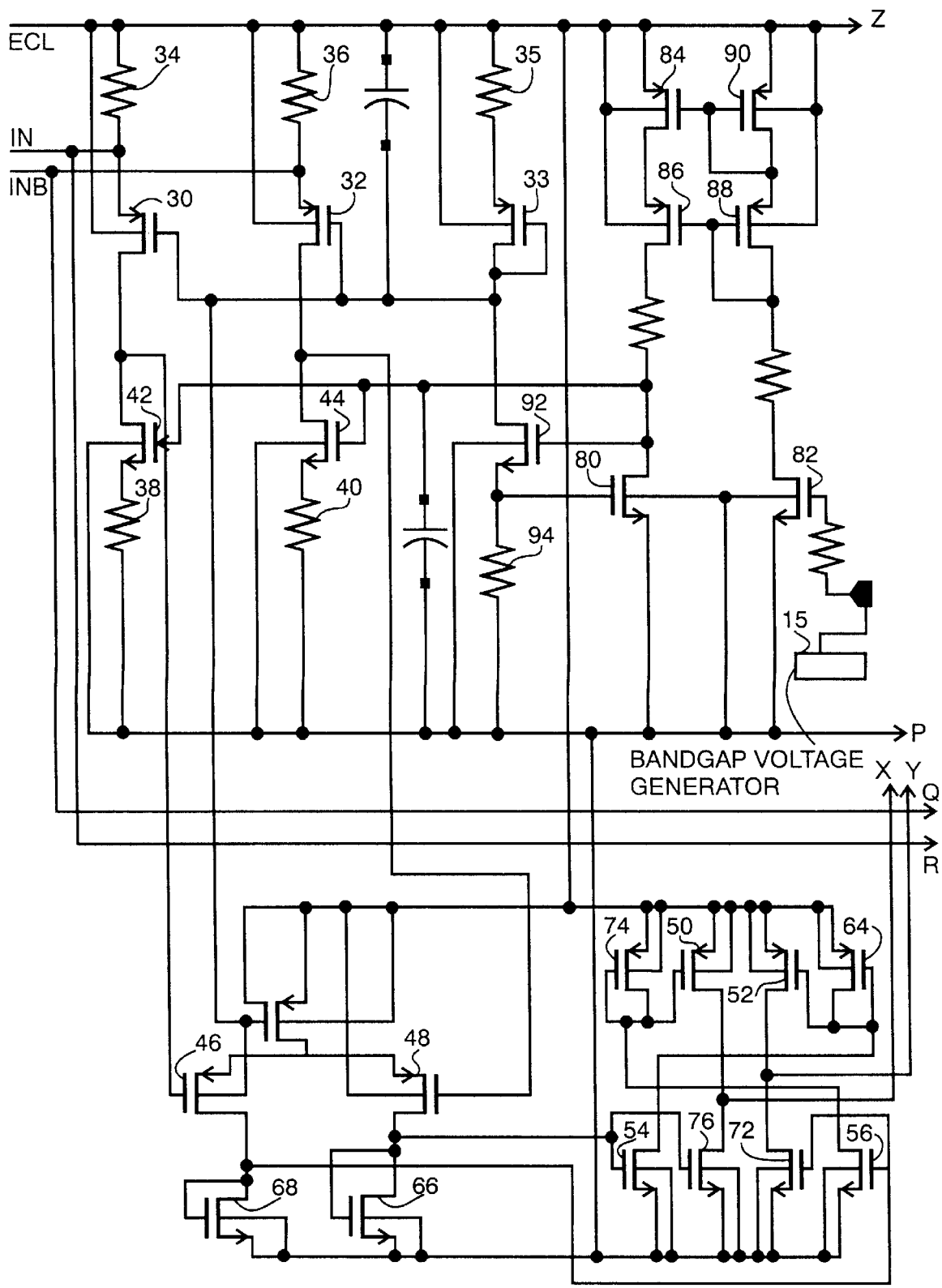
Figure 3B:
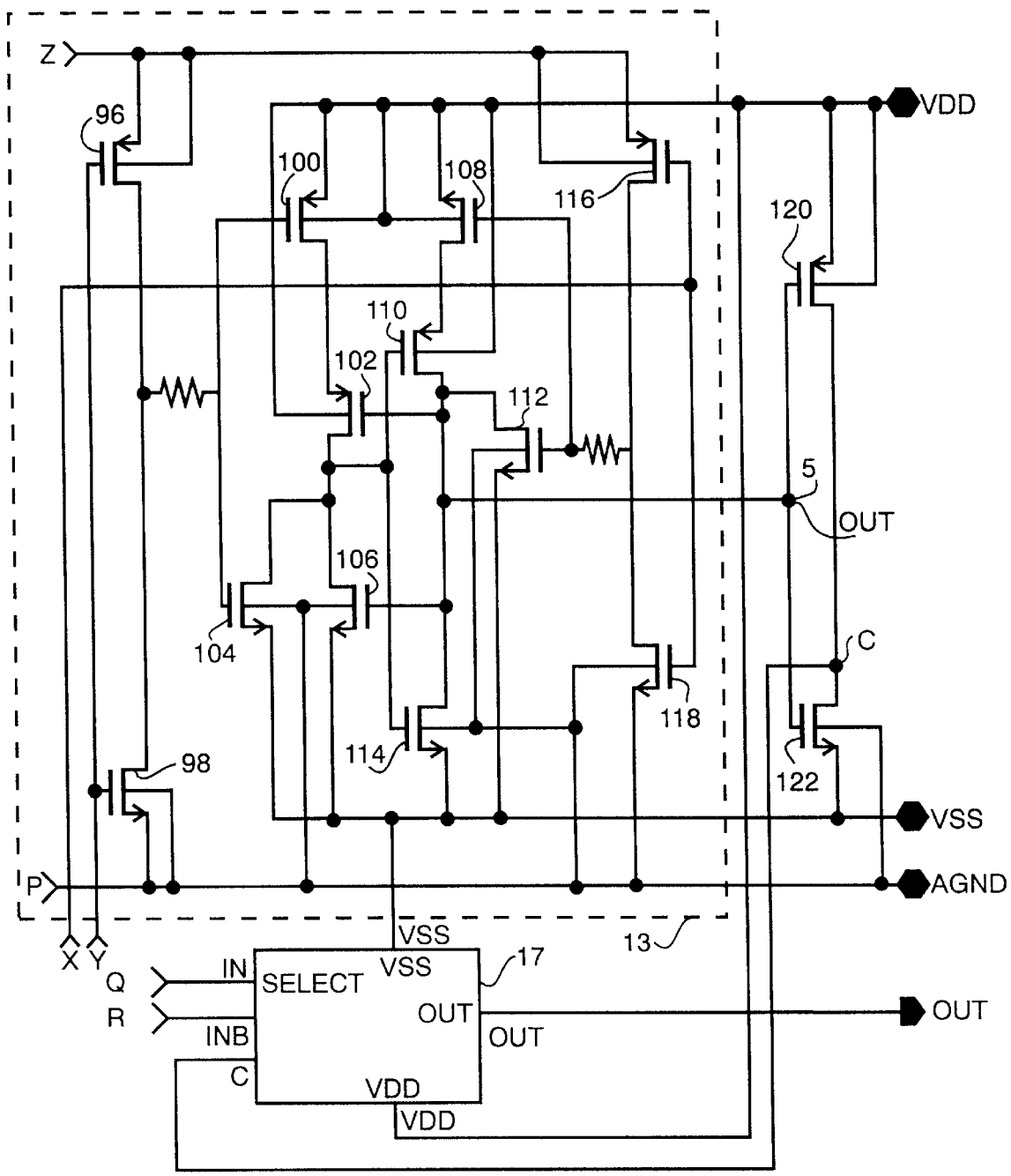
Figure 6:
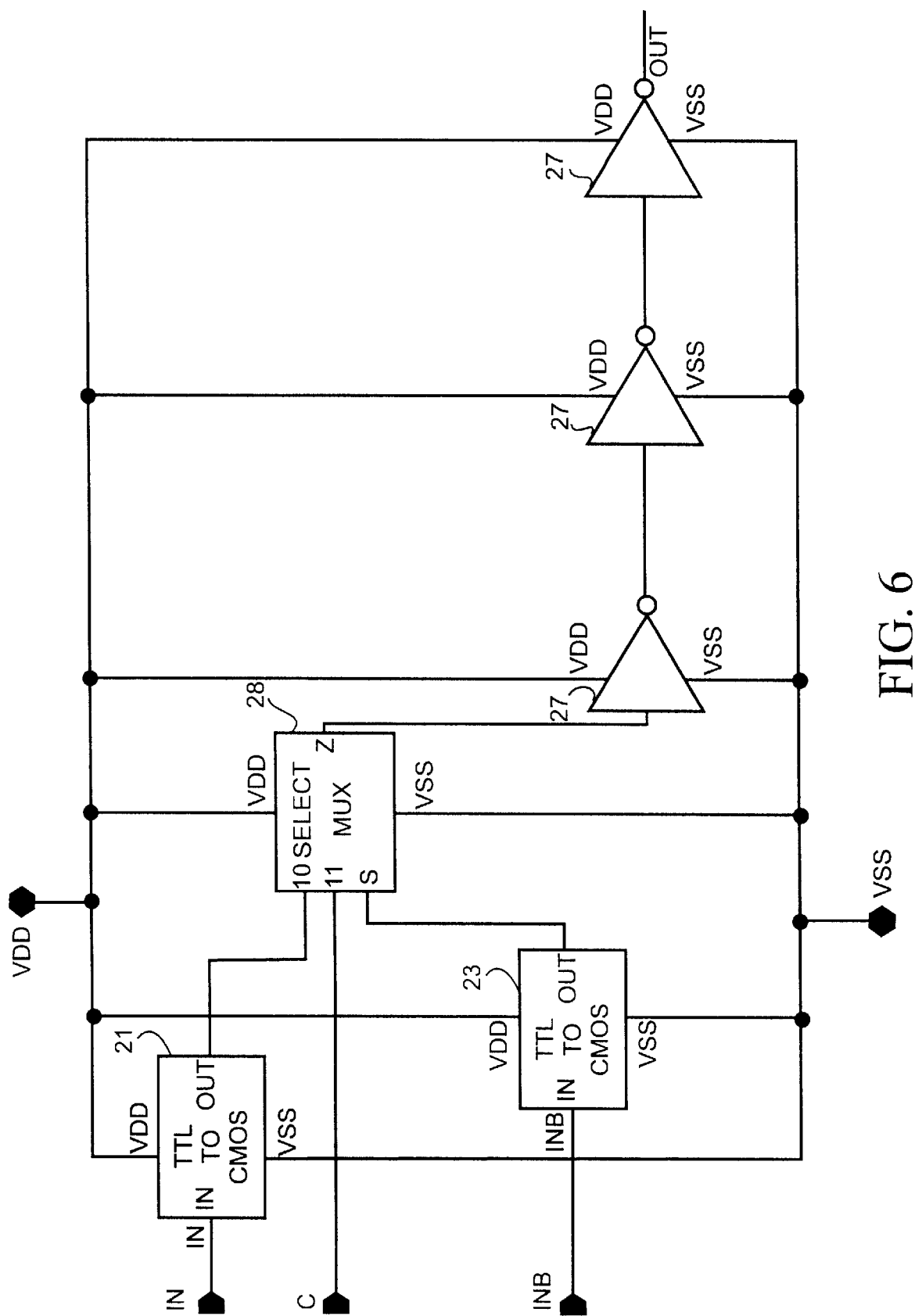

FIGS. 3A and 3B, placed together side be side, are a schematic diagram of a preferred embodiment of the invention, FIG. 4 is a logic diagram representing a portion of FIG. 3B, FIG. 5 is a timing diagram of input and output signals traversing the circuit represented by the logic diagram of FIG. 4, and FIG. 6 is a block diagram of a multiplexer portion of the schematic diagram of FIGS. 2A and 2B.

DETAILED DESCRIPTION OF THE PREFERRED EMBODIMENT

Figure 1:
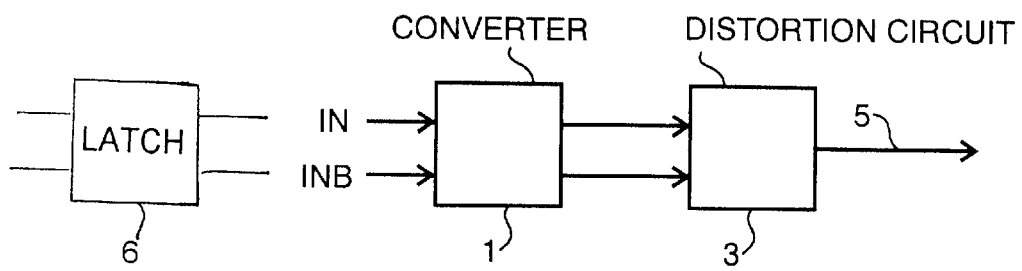
FIG. 1 is a basic block diagram of an embodiment of the invention.

Turning to FIG. 1, a converter 1 receives a differential pair of input signals at inputs IN and INB from the latch 6, and converts them to a single output pulse signal (single ended) the duty cycle of which has a pulse interval which corresponds to a time between rising edges of respective pulses of the differential pair of pulse signals. This single output pulse signal is applied to a distorter circuit. The distorter circuit distorts the single output pulse signal so as to create and deliver at its output 5 a corresponding signal with a duty cycle having longer low logic level intervals than high logic level intervals.

The purpose of this is as follows. Upstream circuitry will naturally introduce duty cycle distortion as the input signal amplitude is reduced. Excessive duty cycle distortion places an onerous constraint on downstream digital circuitry. If the duty cycle is not restored, the signal from the front end of the receiver becomes unusable and the input sensitivity of the receiver is limited not by the receiver front end, but by the downstream digital circuitry's minimum setup and hold time, or minimum pulse width for clock signals. The double-end to single-end converter described above restores duty cycle distortion introduced in the receiver front-end and allows the input sensitivity to be determined by the minimum input sensitivity of the actual circuitry described later, the high-speed differential comparator. In particular the structure described in detail below limits the maximum duty-cycle distortion to the propagation delay of a single NOR gate (or more specifically, the propagation delay from a logic low to logic high transition.

FIG. 2 is a more detailed block diagram of an embodiment of the invention. The input signals IN and INB are applied to a pair of CMOS amplifiers 7A and 7B which are connected in common gate configuration. The outputs of the amplifiers are connected to a differential comparator 9, the outputs of which are connected to the inputs of a pair of latches 11. The outputs of the latches are connected to a double to single end converter 13. A bandgap voltage generator 15 provides a voltage to the amplifiers to set their operating points.

In accordance with another embodiment, one of the input signals, e.g. IN, is connected to the select control input of a multiplexer 17. The other input signal, e.g. INB, is connected to one of inputs to the multiplexer, and the output of the converter 13 is connected to the other of the inputs. An output signal from the circuit is obtained at the output 19 of the multiplexer 17.

The common gate amplifiers receive the differential input signals, referenced to a power supply ECL and AGND, as will be described above. The amplifiers are controlled so that they dynamically adapt to the correct operating point, in a manner to be described below with reference to the detailed implementation. Due to the dynamic and automatic adaptation, high sensitivity is achieved.

The outputs of the common gate amplifiers 7A and 7B are connected to the inputs of a differential comparator 9. Common mode signals introduced by the power supply will be the same in the comparator, and thus will be canceled out.

The output signal of the comparator is applied to the input of latches 11, where full logic level is established, with predistorted duty cycle as described earlier. The differential pair full logic level signals are applied to double to single end converter 13, which provides a resulting output signal having a balanced (50%–50%) duty cycle.

If a TTL input is to be used, input IN is grounded, and a TTL signal is applied to the INB input. The resulting output signal from multiplexer 17 will be at CMOS levels.

If PECL signals are applied to inputs IN and IND, the high speed PEC signal level stream will be obtained as an output signal at CMOS levels from multiplexer 17.

Thus the circuit can be used for low speed data (e.g. TTL reference clocks) or high speed data (e.g. SONET data).

A detailed implementation of an embodiment of the invention is shown in FIGS. 3A and 3B, placed together side by side.

COMMON GATE AMPLIFIER

The input signals IN and INB are applied to the sources of two amplifier FETs 30 and 32 respectively, which are connected in common gate configuration, wherein FET 30 amplifies the signal IN and FET 32 amplifies the signal INB. FETs 42 and 44 are connected to the drains, and in series with FETs 30 and 32 respectively, and form loads therefor. Resistors 34 and 36 are connected in series with the sources of FETs 30 and 32 respectively to a positive analog supply rail ECL. These resistors pull up the inputs and set the input operating points preferably to approximately 1.3 volts below the positive analog supply rail.

The gates of FETs 30 and 32 dynamically adjust to maintain the inputs IN and INB at the correct operating point.

Resistors 38 and 40 are connected in series between the respective sources of FETs 42 and 44 and ECL ground AGND. Resistors 38 and 40 set the currents into the active loads. The gates of FETs 42 and 44 are dynamically adjusted to set the voltage drop across resistors 38 and 40 to preferably 1.3 volts (the nominal switching threshold). The sum of voltage drops across the pull-up resistors 34 and 36 and the pull-down resistors 38 and 40 equals nominally 2.6 volts. The minimum voltage required across a common-gate amplifier—active load pair is 1.1 volt, typically. Therefore the minimum supply rail difference ECL to AGND should be 3.7 volts.

The preferred embodiment of the present invention allows the receiver to be operated in both a differential and single-ended fashion. It should be noted that in single-ended operation, if one of the inputs is left floating, it will bias to the correct switching threshold analogous to an ECL VBB voltage. Unlike ECL circuitry where the VBB signal must be supplied to the unused input, the present invention automatically adapts, implementing either a single-ended buffer or inverter. This is useful because some ODL interfaces operate using either true signal detect or loss of signal. This receiver can be used by both ODL types.

HIGH-SPEED DIFFERENTIAL COMPARATOR

Reliable switching of CMOS logic is not guaranteed with the signal swings out of the common gate amplifiers. The reasons for this are that firstly the output operating points move linearly with the supply rail and may not coincide with the switching threshold of down-stream logic. Secondly, the amplitude of this output signal may not be large enough to fully switch a logic gate when the input amplitude is <800 mV. Thirdly the two single ended signals have poor supply rail noise immunity.

A differential structure is used to increase the gain, and hence guarantee switching of CMOS logic for minimum input signal level, and to improve the supply rail noise immunity. The preferred differential structure is comprised of a high speed differential pair of FETs driving a high speed latch. The composite structure forms a high speed differential comparator.

FETs 46 and 48 form a differential pair, and have their gates connected to the outputs of the common gate amplifiers (i.e. where they connect with active load FETs 42 and 44. With this structure, rail noise becomes common mode to FETs 46 and 48, it becomes rejected. The supply rail noise immunity of the receiver is thus improved.

Active loads comprised of FETs 68 and 66 are connected to FETs 46 and 48. These loads offer modest gain and good high frequency performance.

The outputs of the differential pair 46 and 48, i.e. where they are connected to their respective loads, are connected to the inputs of buffer circuit FETs 56 and 72 via FETs 54 and 76, being connected to the gates thereof. FETs 50 and 52 are switched current sources controlled by diode connected FETs 74 and 64, respectively. FETs 54 and 56 control FETs 74 and 64. The series circuits of FETs 76 and FET 50, and FETs 56 and 52 are connected between ECL and AGND.

When the voltage rises on the drain of FET 66 and falls on the drain of FET 68, FETs 54 and 76 are turned on, and FETs 72 and 56 are turned off. This action causes the current mirror formed by FETs 74 and 50 to turn off. With FET 76 turned on, the drain of 76, forming an output, is pulled to logic low. The other switched current mirror formed by FETs 52 and 64 is turned on, and with FET 72 turned off, the drain of FET 72, forming the other output, is pulled to a logic high.

DOUBLE TO SINGLE ENDED CONVERTER

The double to single ended converter is comprised of FETs 96–118. FET pairs 96 and 98, and 116 and 118 form simple CMOS inverters, connected between ECL and AGND. The junctions of each of the FET pairs are inputs to the converter, and are respectively connected to corresponding outputs of the latches, i.e. the junction of FETs 76 and 50, and 72 and 52 respectively.

In these inverters, the p-channel to n-channel ratios should be established such that their outputs exhibit duty cycle distortion, wherein their output is distorted to create a larger low logic interval than high logic level interval. This intentional distortion is used to limit the maximum output duty-cycle distortion to the propagation delay of a single NOR gate, or more specifically, the propagation delay from a logical low to a logical high transition.

FETs 100–114 which receive the input signal from the high speed latch form a simple RS flip flop, as shown in FIG. 4. The truth table for this flip flop is as follows:

| S | R | O |
|---|---|---|
| 1 | 0 | 1 |
| 0 | 0 | 1 |
| 0 | 1 | 0 |
| 0 | 0 | 0 |
| 1 | 1 | 0 |

(After S = 1, R = 0)

BIAS VOLTAGE GENERATOR

The operating points of a bias voltage generator sets the operating points for the common gate amplifiers and active loads. FETs 80 and 82 form a "pseudo" differential pair, and have their sources connected to AGND. AGND is fixed in potential, and is different from a true differential pair which would share a "virtual" or floating ground.

FETs 84 and 86 (p-channel) are cascoded and are connected as a load to FET 80, and FETs (n-channel) 88 and 90 are connected in series and bias FETs 84 and 86. FETs 84 and 86 form active loads for FETs 80 and 82, FETs 84 and 90 being connected to ECL.

The gate of FET 82 is connected to a source of bandgap voltage VREF having an output potential preferably of 1.3+/−0.1 V. FET 92 has its source connected through a resistor 94 to AGND and its drain through FET 33 and resistor 35 to ECL. The gate of FET 92 is connected to the drain of FET 80. The source of FET 92 is connected to the gate of FET 80. FET 92 thus acts as a follower and sets the potential at its junction with resistor 94 to match the bandgap voltage at VREF.

The gate voltage of FET 92 is thus applied to the gates of the active loads FETs 42 and 44 of the common gate amplifier.

The resistors 38 and 40, which connect the emitters of active load FETs 42 and 44 respectively to AGND, should be half the value of the bias voltage generator circuit resistor 94. The FETs 42 and 44 should be twice as large as FET 92. As a result, the voltage across resistors 38 and 40 will match that at VREF, and the current through FETs 42 and 44 will be double that through FET 92.

The FET 33 and the resistor 35 connected in series thereof to ECL generate the gate bias for the common gate amplifiers 30 and 32. Resistors 34, 36, 38 and 40 should be exact matches. As a result the voltage drop across 34 and 36 will be VREF. If VREF equals 1.3 volt (nominally), the operating point of the inputs IN and INB will be 1.3 volts below the positive supply rail ECL. This corresponds to the nominal switching threshold for ECL circuitry that is referenced to the positive supply rail.

A timing diagram for the input signals to and output signal from the flip flop is shown in FIG. 5. Note that the output pulse width Q is only a function of the time difference between the rising edges of the R and S input signals. If the upstream circuitry has matched propagation delays (which is a good assumption for differential circuitry, the phase difference between the R and S signals, (which correspond to the output signals of the latch), are exactly 90 degrees apart (i.e. ½ of a clock cycle), and the output pulse width will be 50% minus the low to high propagation delay of a NOR gate.

This has significant advantages. The upstream circuitry will naturally introduce duty cycle distortion as the input signal amplitude is reduced. Excessive duty cycle distortion places an onerous constraint on downstream digital circuitry. If the duty cycle were not restored, the signal from the front end of the receiver becomes unusable, and the input sensitivity would be limited not by the receiver front end, but by the downstream digital circuitry's minimum setup and hold time, or minimum pulse width, for clock signals. Therefore the inverters 96, 98, 116, 118 predistort the duty cycle, thus restoring duty cycle distortion introduced in the receiver front end and allows the input sensitivity to be determined by the minimum input sensitivity of the high speed differential comparator.

The flip flop also improves the quality of the output signal at output terminal 5, in the presence of large input signals. If minimum input sensitivity were not of concern, the output signal could be created by buffering a single output of the high speed latch with a simple CMOS inverter. However, the duty cycle would be strongly dependent on the strength of the p- and n-channels of the inverter. In the design of the double to single ended converter described above, the predistortion of even robust output signals of the high speed latch, guarantees restoration of the duty cycle of the receiver.

While the CMOS inverters comprised of FETs 96, 98, 116 and 118 are connected between ECL and AGND, the flip flop is connected between VDD and VSS, which converts the output logic levels to CMOS values.

The output signal of the flip flop, at output 5, is applied to the input of a CMOS inverter formed of FETs 120 and 122, connected between VDD and VSS. The output of the latter CMOS inverter is taken at the junction of the drains of the latter FETs.

TTL SIGNAL BYPASS

Multiplexer 17 is connected with its components between voltage rails VSS and VDD, which can be used to allow the receiver to be extended to operate with TTL signal level. One of the input signals, e.g. IN as shown, is connected to an input select input of the multiplexer. The other input signal INB and the output of the CMOS inverter formed of FETs M27 and M28 are connected to respective inputs of the multiplexer.

In normal operation, the select (IN) input of the multiplexer 17 is at high logic level, and as a result the output of the double to single ended converter is selected to pass through the multiplexer to its output terminal OUT. However, if the IN input is pulled to ground, the signal at input INB is selected and passes through the multiplexer to its output terminal. This provides the TTL signal level output.

FIG. 6 illustrates a preferred design of the multiplexer 17. The input signals IN and INB are applied to the inputs of respective TTL to CMOS converters 21 and 23. The outputs of the converters 21 and 23 are connected one to the select terminal and one to an input of multiplexer circuit 27. The output of the inverter formed of FETs 120 and 122 is connected to the other input of multiplexer circuit 25. The output of multiplexer 25 is connected through a preferably odd series of inverters (three being shown) to a output terminal OUT.

While the basic operation of the above has been described with reference to the circuit of FIGS. 3A and 3B, it should be noted that by loading both high speed inputs with the inverters 27, the PECL signal level driving circuitry is balanced.

Because the PECL signal swings are relative to the positive supply rail, a TTL to CMOS converter tied to one of the inputs cannot cross its switching threshold during normal operation. However, if the input is pulled to ground, which is an unlikely condition during normal PECL operation, the TTL to CMOS converter will switch. In this manner, one of the PECL inputs has been used to program the receiver's input signal level.

It should be noted that the circuit of FIG. 6 can be driven from low speed loss of signal (LOS) inputs, reference clock, or high speed clock inputs, and need not be driven from one of the IN or INB inputs.

A person understanding this invention may now conceive of alternative structures and embodiments or variations of the above. All of those which fall within the scope of the claims appended hereto are considered to be part of the present invention.

I claim:

1. A pulse receiver, comprising:
   (a) a pair of complementary symmetry metal oxide silicon (CMOS) common gate amplifiers connected between a 5 volt supply (ECL) voltage rail and an ECL ground (AGND), for receiving a pair of pulse input signals IN and INB and for providing a pair of first pulse signals,
   (b) CMOS means for distorting said first pulse signals, to create second pulse signals from said converter having a duty cycle having a longer low logic level interval than high logic level interval,
   (c) a CMOS latch for receiving and latching said second output signals from the common gate amplifiers at logic levels compatible with circuits formed of CMOS elements,
   (d) a CMOS double to single ended converter connected between a VDD voltage rail and VSS ground, for receiving the latched output signals,
   (e) means for providing an output signal referenced to VDD and ground from said converter.

2. A pulse receiver as defined in claim 1 including a CMOS differential comparator connected between outputs of the common gate amplifiers and the latch for receiving said pair of pulse output signals and for canceling common mode noise signals contained in said pulse output signals.

3. A pulse receiver as defined in claim 1 including means for fixing operating points of said common gate amplifiers to about 1.3 volts below ECL voltage level.

4. A pulse receiver as defined in claim 1 further including a multiplexer, means for applying one of the input signals and said output signal to respective inputs of the multiplexer, means for applying another of the input signals to a control input of the multiplexer, and means for receiving a CMOS output signal from the multiplexer in the event said another of the input signals is a TTL pulse signal and for receiving a CMOS output signal from the multiplexer.

5. A pulse receiver as defined in claim 4 including a CMOS differential comparator connected between outputs of the common gate amplifiers and the latch for receiving said pair of pulse output signals and for canceling common mode noise signals contained in said pulse output signals.

6. A pulse receiver as defined in claim 5 further including a multiplexer, means for applying one of the input signals and said output signal to respective inputs of the multiplexer, means for applying another of the input signals to a control input of the multiplexer, and means for receiving a pseudo ECL (PECL) output signal from the multiplexer in the event said another of the input signals is a PECL pulse signal.

* * * * *